US012765170B2

(12) United States Patent
Lim et al.

(10) Patent No.: US 12,765,170 B2
(45) Date of Patent: Oct. 13, 2026

(54) DISPLAY DEVICE

(71) Applicant: LG ELECTRONICS INC., Seoul (KR)

(72) Inventors: Byungkil Lim, Seoul (KR); Kyoungjoon Lee, Seoul (KR); Sejin Kwon, Seoul (KR); Doyoung Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 487 days.

(21) Appl. No.: 18/465,606

(22) Filed: Sep. 12, 2023

(65) Prior Publication Data

US 2024/0107802 A1 Mar. 28, 2024

(30) Foreign Application Priority Data

Sep. 28, 2022 (KR) ........................ 10-2022-0123159

(51) Int. Cl.
*H10K 59/12* (2023.01)
*H10K 59/131* (2023.01)
*H10K 59/80* (2023.01)

(52) U.S. Cl.
CPC ....... *H10K 59/1201* (2023.02); *H10K 59/131* (2023.02); *H10K 59/8722* (2023.02)

(58) Field of Classification Search
None
See application file for complete search history.

(56) References Cited

U.S. PATENT DOCUMENTS

2022/0346287 A1* 10/2022 Kang ................. H05K 7/20963

FOREIGN PATENT DOCUMENTS

KR 10-2012-0067506 6/2012
KR 10-2014-0113017 9/2014
KR 10-2021-0088343 7/2021

OTHER PUBLICATIONS

European Patent Office Application Serial No. 23198146.5, Search Report dated Feb. 27, 2024, 10 pages.

* cited by examiner

*Primary Examiner* — Kyoung Lee
(74) *Attorney, Agent, or Firm* — LEE, HONG, DEGERMAN, KANG & WAIMEY

(57) ABSTRACT

A display device is provided. The display device includes: a display panel; a material complexed plate disposed at a rear of the display panel; and a side frame which is disposed between the display panel and the material complexed plate and is fixed to the material complexed plate, and to which the display panel is coupled, wherein the material complexed plate includes: a front skin forming a front surface; a rear skin forming a rear surface and facing the front skin; and a core disposed between the front skin and the rear skin and including fibers; and an inner frame formed by recessing the front skin or the rear skin, wherein the inner frame includes: horizontal inner lines elongated in one direction; and vertical inner lines elongated in a direction intersecting the one direction.

11 Claims, 22 Drawing Sheets

DISPLAY DEVICE

CROSS-REFERENCE TO RELATED APPLICATION(S)

Pursuant to 35 U.S.C. § 119(a), this application claims the benefit of earlier filing date and right of priority to Korean Patent Application No. 10-2022-0123159, filed on Sep. 28, 2022, the contents of which are all hereby incorporated by reference herein in their entireties.

BACKGROUND OF THE INVENTION

1. Field of the Invention

The following description relates to a display device.

2. Description of the Related Art

With the development of the information society, there have been growing demands for various types of display devices, and in order to meet these demands, various display devices, such as a liquid crystal display (LCD), a plasma display panel (PDP), an electroluminescent display (ELD), a vacuum fluorescent display (VFD), an organic light emitting diode (OLED), etc., have been studied and used recently.

Among them, a display device using an organic light emitting diode (OLED) has excellent luminance and viewing angle characteristics in comparison with a liquid crystal display device, and does not require a backlight unit, such that the OLED display device can be implemented as an ultra-thin display device.

Recently, a structure for ensuring rigidity of a large-screen, ultra-thin display device and for dissipating heat generated in the display device displaying high-definition images is being actively researched.

SUMMARY OF THE INVENTION

It is an objective of the present disclosure to solve the above and other problems.

It is another objective of the present disclosure to ensure structural rigidity of a large-screen and ultra-thin display device.

It is yet another objective of the present disclosure to prevent thermal deformation of a display device while ensuring high temperature reliability.

In accordance with an aspect of the present disclosure, the above and other objectives can be accomplished by providing a display device including: a display panel; a material complexed plate disposed at a rear of the display panel; and a side frame which is disposed between the display panel and the material complexed plate and is fixed to the material complexed plate, and to which the display panel is coupled, wherein the material complexed plate includes: a front skin forming a front surface; a rear skin forming a rear surface and facing the front skin; and a core disposed between the front skin and the rear skin and including fibers; and an inner frame formed by recessing the front skin or the rear skin, wherein the inner frame includes: horizontal inner lines elongated in one direction; and vertical inner lines elongated in a direction intersecting the one direction.

Effects of the Invention

The display device according to the present disclosure has the following effects.

According to at least one of the embodiments of the present disclosure, structural rigidity of a large-screen and ultra-thin display device may be provided.

According to at least one of the embodiments of the present disclosure, thermal deformation of a display device may be prevented while ensuring high temperature reliability.

Further scope of applicability of the present disclosure will become apparent from the detailed description given hereinafter. However, it should be understood that the detailed description and specific examples, while indicating preferred embodiments of the present disclosure, are given by illustration only, since various changes and modifications within the spirit and scope of the present disclosure will become apparent to those skilled in the art from this detailed description.

DETAILED DESCRIPTION OF THE PREFERRED EMBODIMENTS

Figure 1:
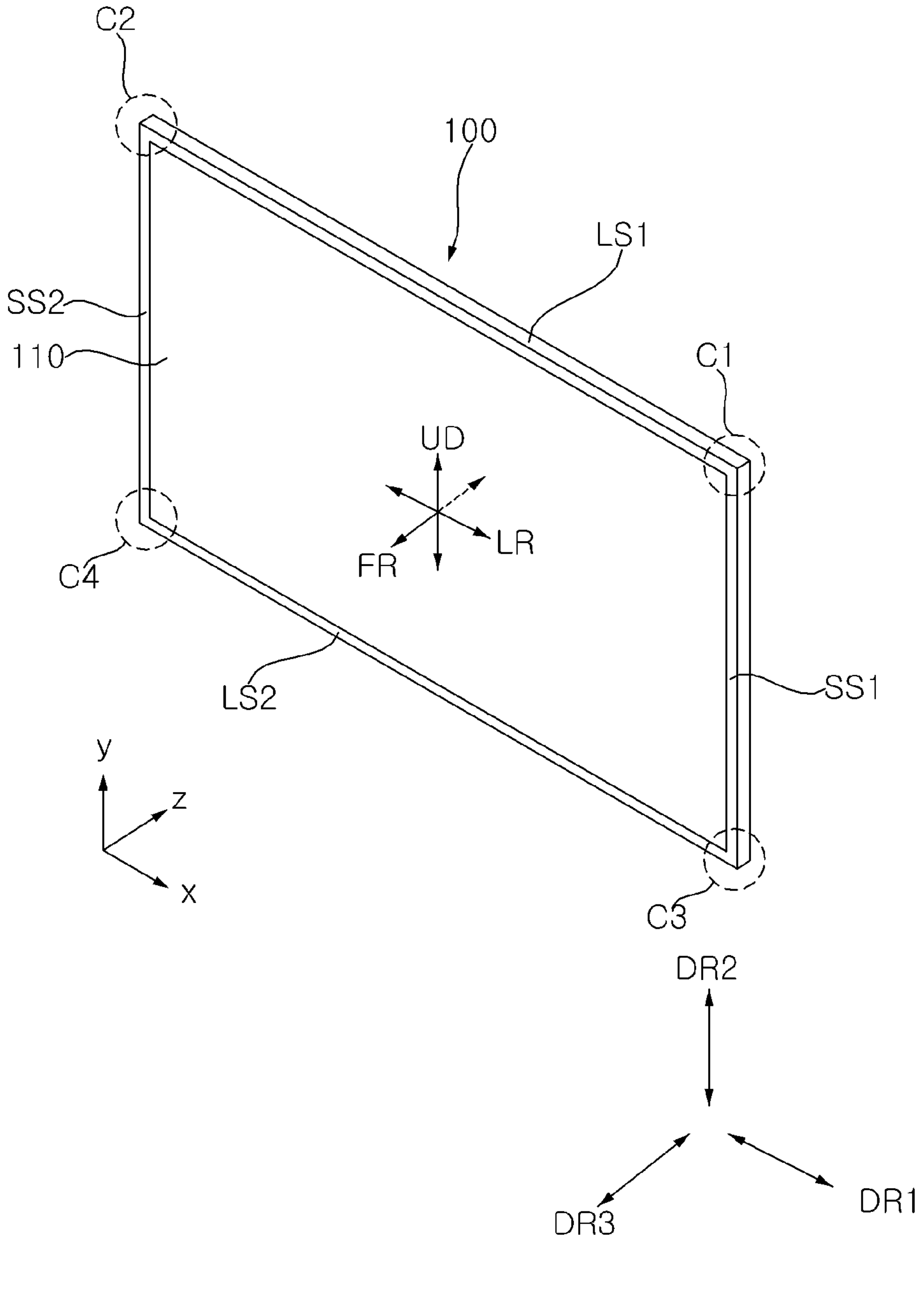
FIGS. 1 to 22 are diagrams illustrating examples of a display device according to embodiments of the present disclosure.

Hereinafter, the present disclosure will be described in detail with reference to the accompanying drawings, in which the same reference numerals are used throughout the drawings to designate the same or similar components, and a redundant description thereof will be omitted.

The suffixes, such as "module" and "unit," for elements used in the following description are given simply in view of the ease of the description, and do not have a distinguishing meaning or role.

In addition, it will be noted that a detailed description of known arts will be omitted if it is determined that the detailed description of the known arts can obscure the embodiments of the present disclosure. Further, the accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A singular representation may include a plural representation unless context clearly indicates otherwise.

In the following description, even if an embodiment is described with reference to a specific figure, reference numeral not appearing in the specific figure may be referred to if necessary, and reference numeral not appearing in the specific figure is used when the reference numeral appears in the other figures.

Referring to FIG. 1, a display device 100 may include a display panel 110. The display panel 110 may display images.

The display device 100 may include a first long side LS1, a second long side LS2 opposite to the first long side LS1, a first short side SS1 adjacent to the first long side LS1 and the second long side LS2, and a second short side SS2 opposite to the first short side SS1.

For convenience of explanation, it is illustrated and described that the first and second long sides LS1 and LS2 are longer than the first and second short sides SS1 and SS2, but it is also possible that lengths of the first and second long sides LS1 and LS2 may be approximately equal to lengths of the first and second short sides SS1 and SS2.

A direction parallel to the long sides LS1 and LS2 of the display device 100 may be referred to as a first direction DR1 or a left-right direction LR. A direction parallel to the short sides SS1 and SS2 of the display device 100 may be referred to as a second direction DR2 or an up-down direction UD.

A direction perpendicular to the long sides LS1 and LS2 and the short sides SS1 and SS2 of the display device 100 may be referred to as a third direction DR3 or a front-rear direction FR. Here, a side on which the display panel 110 displays an image may be referred to as a front side, and a side opposite thereto may be referred to as a rear side.

Hereinafter, the display panel 110 will be described using an Organic Light Emitting Diode (OLED) display panel as an example, but the display panel 110 which may be applied to the present disclosure is not limited thereto.

The display panel 110 may form a front surface of the display device 100 and may display images on the front side. The display panel 110 may divide an image into a plurality of pixels and may output the image while controlling color, brightness, and chroma of the respective pixels. The display panel 110 may be divided into an active area, in which the image is displayed, and a de-active area in which the image is not displayed. The display panel 110 may generate light corresponding to red, green, or blue color in response to a control signal.

Figure 2:
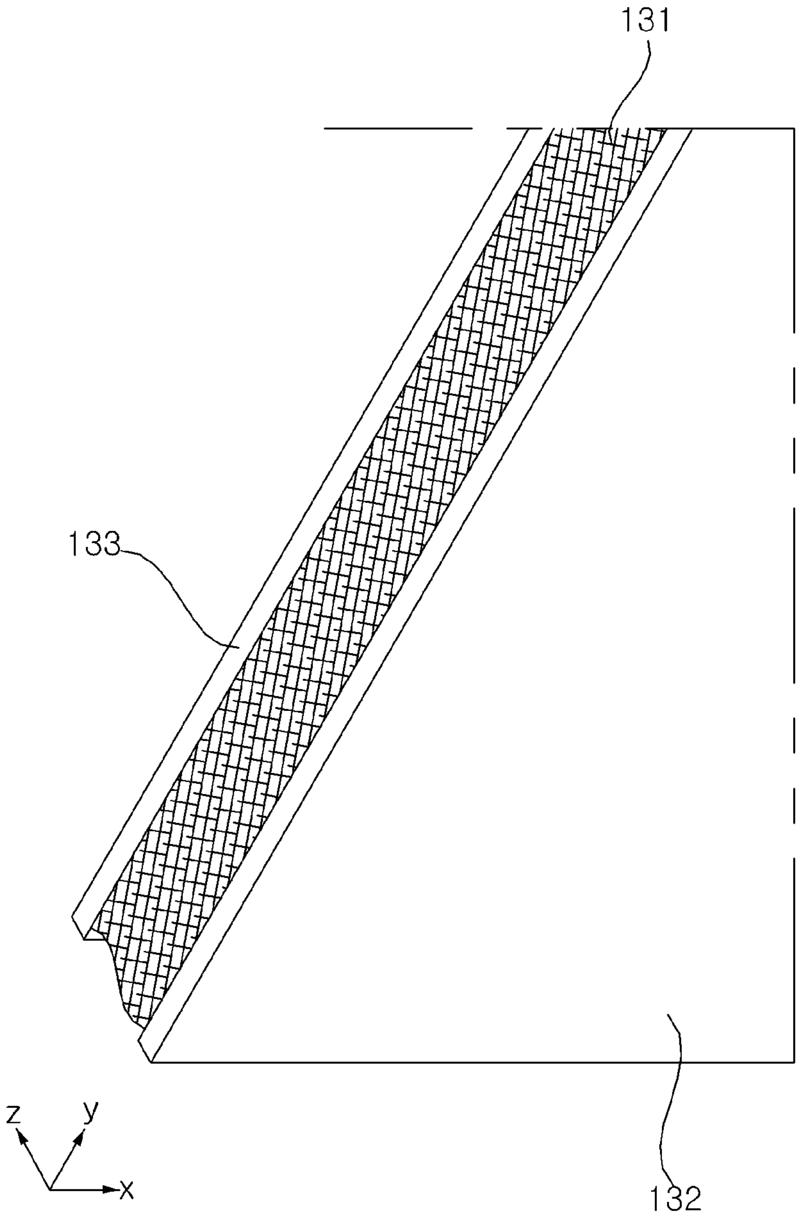

Referring to FIG. 2, a material complexed panel 130 may include a core 131, a front skin 132, and a rear skin 133. The core 131, the front skin 132, and the rear skin 133 may be bonded to each other. The material complexed panel 130 may be referred to as a fiber complexed panel 130, a fiber complexed plate 130, a material complexed plate 130, or a middle frame 130.

The front skin 132 may form a front surface of the material complexed panel 130. The rear skin 133 may form a rear surface of the material complexed panel 130. The front skin 132 and the rear skin 133 may include a metal material.

For example, the front skin 132 and the rear skin 133 may be galvanized iron. In another example, the front skin 132 and the rear skin 133 may include aluminum (Al).

For example, the front skin 132 and the rear skin 133 may have a thickness of 0.2 mm to 0.5 mm. In another example, the front skin 132 and the rear skin 133 made of galvanized iron may have a thickness of 0.27 mm. In another example, the front skin 132 and the rear skin 133 including aluminum may have a thickness of 0.5 mm.

The front skin 132 and the rear skin 133 may be disposed opposite each other with respect to the core 131 to be described later. The core 131 may be disposed between the front skin 132 and the rear skin 133. The core 131 may include fibers. The core 131 may be made of a composite material. The core 131 may include a main fiber and a binder fiber. The binder fiber may be mixed into the main fiber.

The front skin 132 and/or the rear skin 133 may be bonded to the core 131 by a hot melt method. A hot-melt sheet may be disposed between the front skin 132 and the core 131, and a hot-melt sheet may be disposed between the rear skin 133 and the core 131. The hot-melt sheet may be a film. For example, the hot-melt sheet may be a film, such as EVA, acryl, polyurethane, etc., which has a thickness of 50 μm or more. After placing the core 131 between the front skin 132 and the rear skin 133 with the hot-melt sheets, the core 131 may be subjected to a roll lamination process at 190 degrees Celsius for one minute or more.

Accordingly, bending stiffness and/or torsional stiffness of the display device may be improved.

Figure 3:
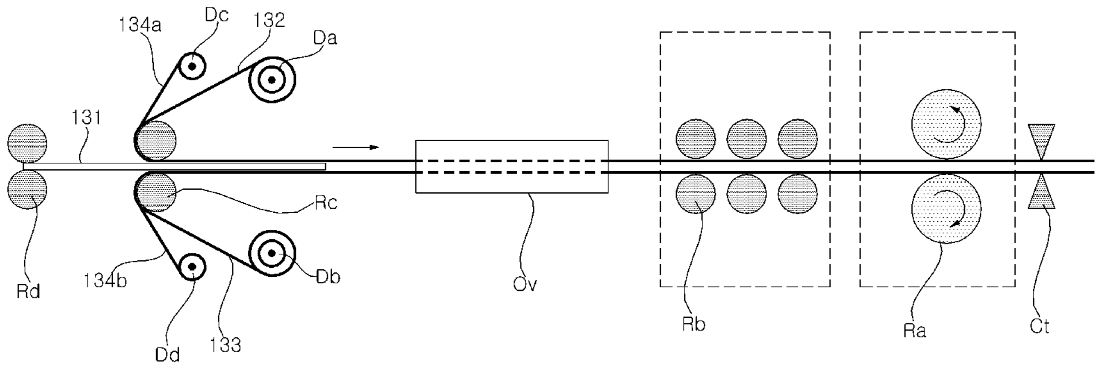
Figure 4:
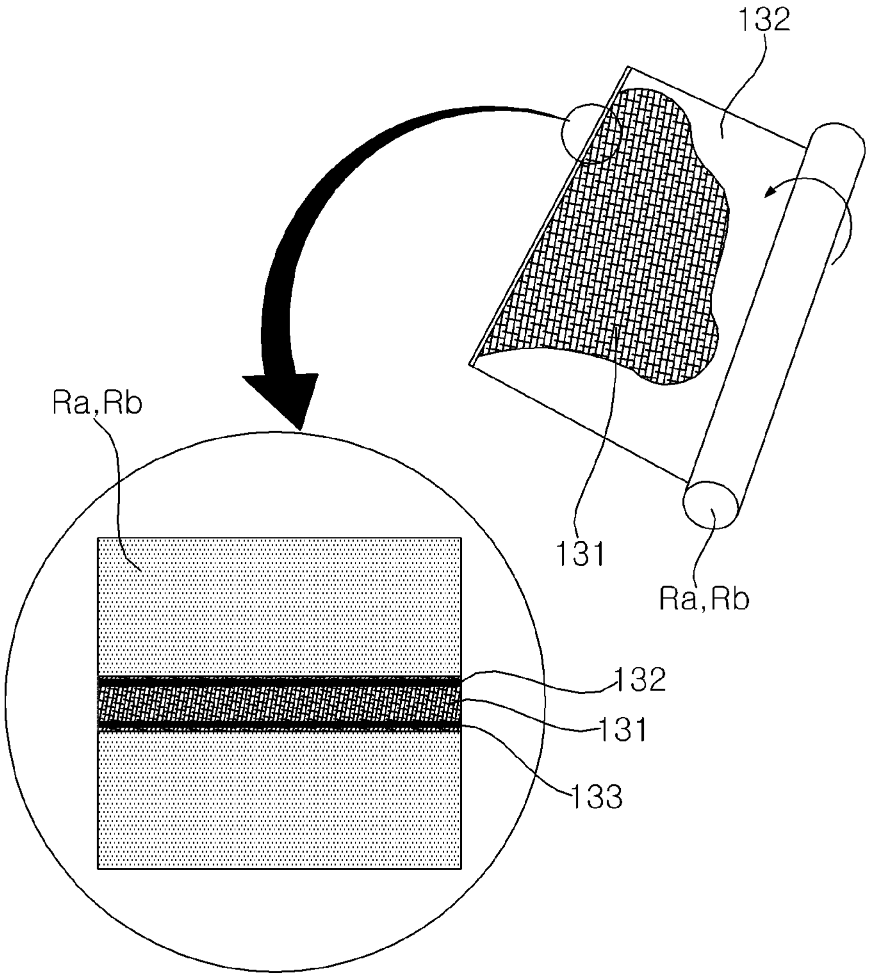

Referring to FIGS. 3 and 4, the material complexed panel 130 may be produced by pressing the front skin 132 and the rear skin 133 to the core 131 using a plurality of rollers, and this process may be referred to as a roll-to-roll process.

Referring to FIG. 3, by rotation of a pinch roller Ra acting as a driving motor, the front skin 132 is unwound from a front drum Da, the rear skin 133 is unwound from a rear drum Db, and the core 131 moves through a feeding roller Rd. Then, a first adhesive 134*a* for bonding the front skin 132 to the core 131 may be unwound from the first drum Dc. In addition, a second adhesive 134*b* for bonding the rear skin 133 to the core 131 may be unwound from the second drum db. In this case, the front skin 132, the first adhesive 134*a*, the core 131, the second adhesive 134*b*, and the rear skin 133 are laminated in this order and may be guided by a guide roller RC toward an oven Ov. The adhesives 134*a* and 134*b* may be hot-melt sheets 134*a* and 134*b*.

The first and second adhesives 134*a* and 134*b* are melted in the oven Ov to allow each of the front skin 132 and the rear skin 133 to be bonded to the core 131. For example, the first and second adhesives 134*a* and 134*b* may have a melting point of about 150° C., and ambient temperature of the oven Ov may be about 200° C. For example, the first and second adhesives 134*a* and 134*b* may have a peel-off force of about 10 kgf or more.

After passing through the oven Ov, the front skin 132, the core 131, and the rear skin 133 may be guided to a pressure roller Rb by the rotation of the pinch roller Ra and may be pressed by the pressure roller Rb, thereby further strengthening the bonding force between the front skin 132, the core 131, and the rear skin 133. After passing through the pinch roller Ra, the front skin 132, the core 131, and the rear skin 133 which are bonded together may be cut by a cutter Ct, such that the material complexed panel 130 may be manufactured in a predetermined size.

Referring to FIG. 4, the pressure roller Rb or the pinch roller Ra may come into contact with an outer surface of each of the front skin 132 and the rear skin 133. When the pressure roller Rb or the pinch roller Ra rotates, the material complexed panel 130 may move in a longitudinal direction (i.e., left-right direction LR) of the core 131. In this case, the front skin 132 and the rear skin 133 may be bonded to the core 131 sequentially from a first end to a second end of the core 131 in the longitudinal direction of the core 131.

In addition, the front skin 132 and the rear skin 133 of the material complexed panel 130 may be formed flat. That is, a rear surface of the rear skin 133 that forms a rear surface of the display device 100 is formed flat, thereby facilitating an additional process of coating the rear surface of the rear skin 133 or attaching a sheet thereto or the like for aesthetic purposes.

In addition to using the roll-to-roll process described above with reference to FIGS. 3 and 4 for making flat the front skin 132 and the rear skin 133, a process of sequentially laminating and bonding the front skin 132, the core 131, and the rear skin 133 may also be used to bond together the core 131, the front skin 132, and the rear skin 133.

Figure 5:
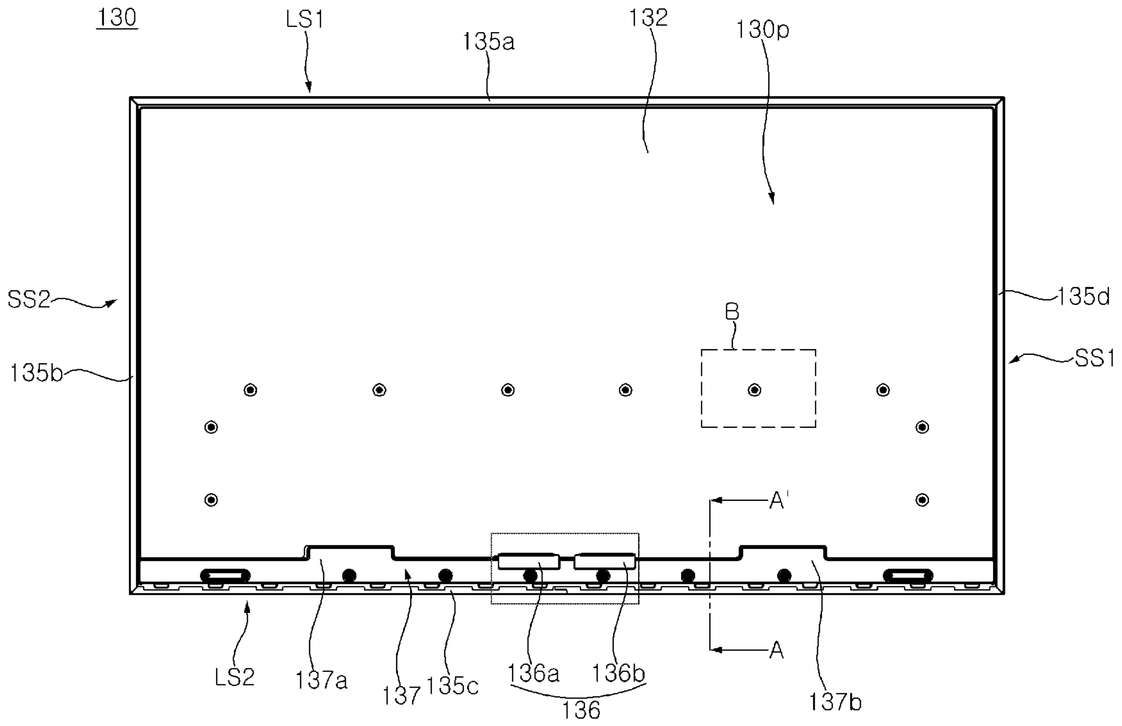

Referring to FIG. 5, the material complexed panel 130 may include a flat plate part 130P, a receiving part 137, an outer part 135. The outer part 135 may be formed on a periphery of the flat plate part 130P. A first outer part 135*a* may be formed along an upper side of the flat plate part 130P, a second outer part 135*b* may be formed along a left side of the flat plate part 130P, a third outer part 135*c* may be formed along a lower side of the flat plate part 130P, and a fourth outer part 135*d* may be formed along a right side of the flat plate part 130P. The outer part 135 may be formed by pressing the flat plate part 130P. The outer part 135 may be stepped downward from the flat plate part 130P. A thickness of the flat plate part 130P may be greater than a thickness of the outer part 135.

A cable hole 136 may be formed through the front skin 132 (see FIG. 2) and the rear skin 133 (see FIG. 2) of the receiving part 137. The cable hole 136 may be formed in the receiving part 137 at a position adjacent to the lower side of the flat plate part 130P. There may be a plurality of cable holes 136. A first cable hole 136*a* may be formed next to a second cable hole 136*b*.

The receiving part 137 may be formed between the flat plate part 130P and the third outer part 135*c* at a position adjacent to the lower side of the flat plate part 130P. There may be a plurality of receiving parts 137. A first receiving part 137*a* may be disposed between the first cable hole 136*a* and the second short side SS2. A second receiving part 137*b* may be disposed between the second cable hole 136*b* and the first short side SS1. The receiving part 137 may be formed by pressing the flat plate part 130P. The receiving part 137 may be stepped downward from the flat plate part 130P and/or the outer part 135*c*.

Figure 6:
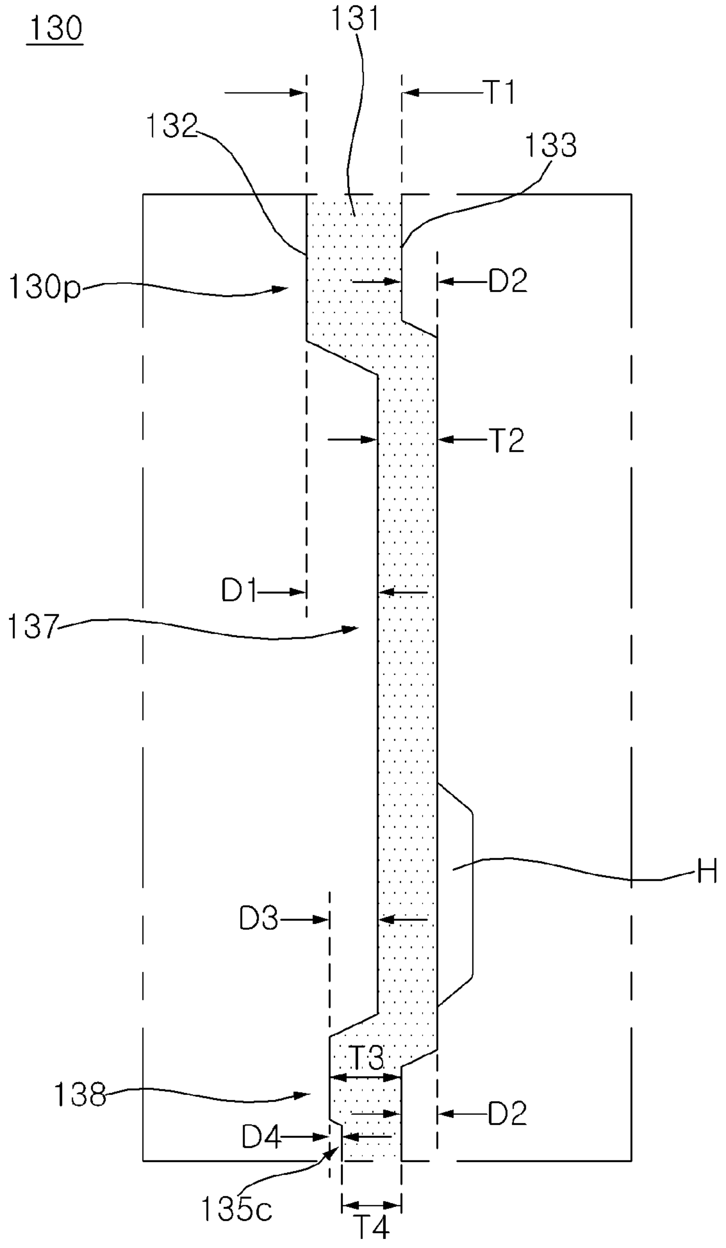

Referring to FIG. 6, the receiving part 137 may be formed by pressing the flat plate part 130P. The front skin 132 of the receiving part 137 may form a step D1 that is stepped downward from the front skin 132 of the flat plate part 130P. The rear skin 133 of the receiving part 137 may form a step D2 that is stepped upward from the rear skin 133 of the flat plate part 130P. In this case, a height of the step D1, which is stepped downward from the front skin 132 of the flat plate part 130P toward the front skin 132 of the receiving part 137, may be greater than a height of the step D2 which is stepped upward from the rear skin 133 of the flat plate part 130P toward the rear skin 133 of the receiving part 137. A thickness T1 of the flat plate part 130P may be greater than a thickness T2 of the receiving part 137.

By being pressed from the front skin 132 of the flat plate part 130P toward the rear skin 133 thereof, the core 131 of the material complexed panel 130 may absorb external force. A magnitude of external force applied to the front skin 132 of the flat plate part 130P may be greater than a magnitude of external force applied to the rear skin 133 of the flat plate part 130P. The core 131 of the material complexed panel 130 not only absorbs impact but also ensures rigidity.

A thickness T4 of the third outer part 135*c* may be greater than the thickness T2 of the receiving part 137. A step D2 may be formed which is stepped upward from the rear skin 133 of the third outer part 135*c* toward the rear skin 133 of the receiving part 137. A height of the step D2 formed between the rear skin 133 of the third outer part 135*c* and the rear skin 133 of the receiving part 137 may be equal to a height of the step D2 formed between the rear skin 133 of the receiving part 137 and the rear skin 133 of the flat plate part 130P.

A protruding pad 138 may protrude from the front skin 132 of the third outer part 135*c*. A step D4 may be formed which is stepped downward from the front skin 132 of the protruding pad 138 toward the front skin 132 of the third outer part 135*c*. A height of the step D4 formed between the third outer part 135*c* and the protruding pad 138 may be smaller than the heights of the steps D1 and D2 formed between the flat plate part 130P and the receiving part 137. A step D3 may be formed which is stepped downward from the front skin 132 of the protruding pad 138 toward the front skin 132 of the receiving part 137. A thickness T3 of the protruding pad 138 may be greater than the thickness T4 of the third outer part 135*c*, may be smaller than the thickness T1 of the flat plate part 130P, and may be smaller than the thickness T2 of the receiving part 137.

A fastening groove H may protrude from the rear skin 133 of the receiving part 137. The fastening groove H may be recessed from the front skin 132 of the receiving part 137 and may protrude from the rear skin 133 of the receiving part 137. A center of the fastening groove H may be penetrated.

Figure 7:
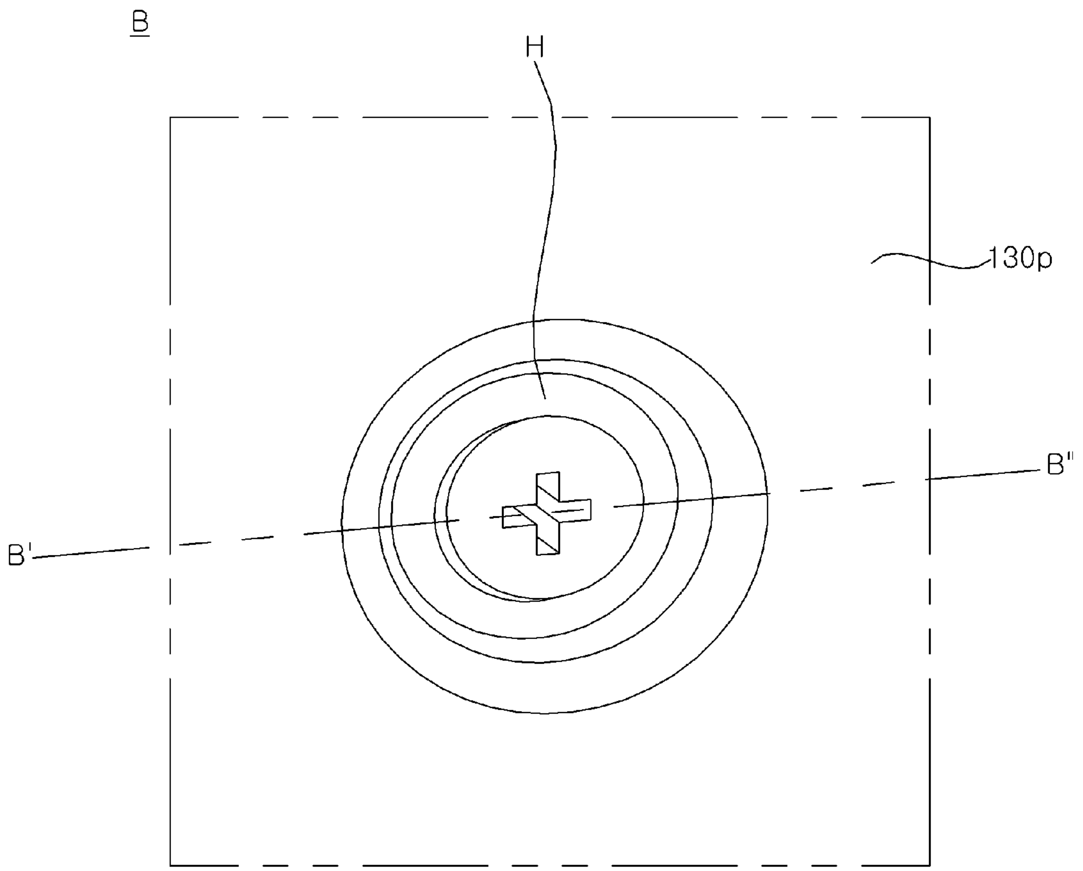
Figure 8:
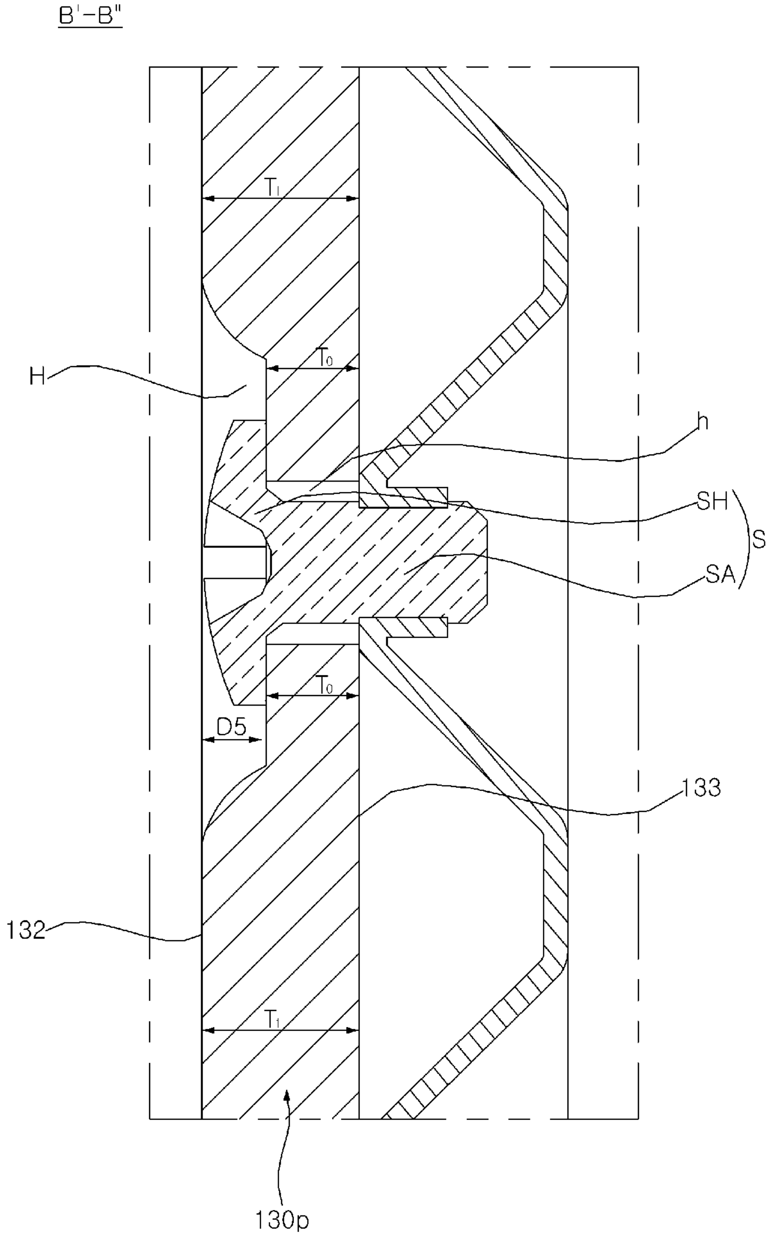

Referring to FIGS. 7 and 8, the fastening groove H may be formed in the flat plate part 130P. The fastening groove H may be formed by pressing the flat plate part 130P. The front skin 132 of the fastening groove H may be recessed from the front skin 132 of the flat plate part 130P. The rear skin 133 of the flat plate part 130P and the rear skin 133 of the fastening groove H may form the same plane. A thickness TO of the fastening groove H may be smaller than the thickness T1 of the flat plate part 130P.

A fastening hole h may be formed at the center of the fastening groove H. A fastening hole h may be formed by punching the fastening groove H. The fastening hole h may be formed through the front skin 132 and the rear skin 133 of the fastening groove H. A length of a shaft SA of the fastening member S may be greater than the thickness TO of the fastening groove H. The shaft SA of the fastening member S may be inserted into the fastening groove H to protrude through the fastening hole h to the outside of the rear skin 132 of the fastening groove H. A depth D5 of the fastening groove H may be greater than a thickness of a head SH. The head SH of the fastening member S may be concealed in the fastening groove H.

Figure 9:
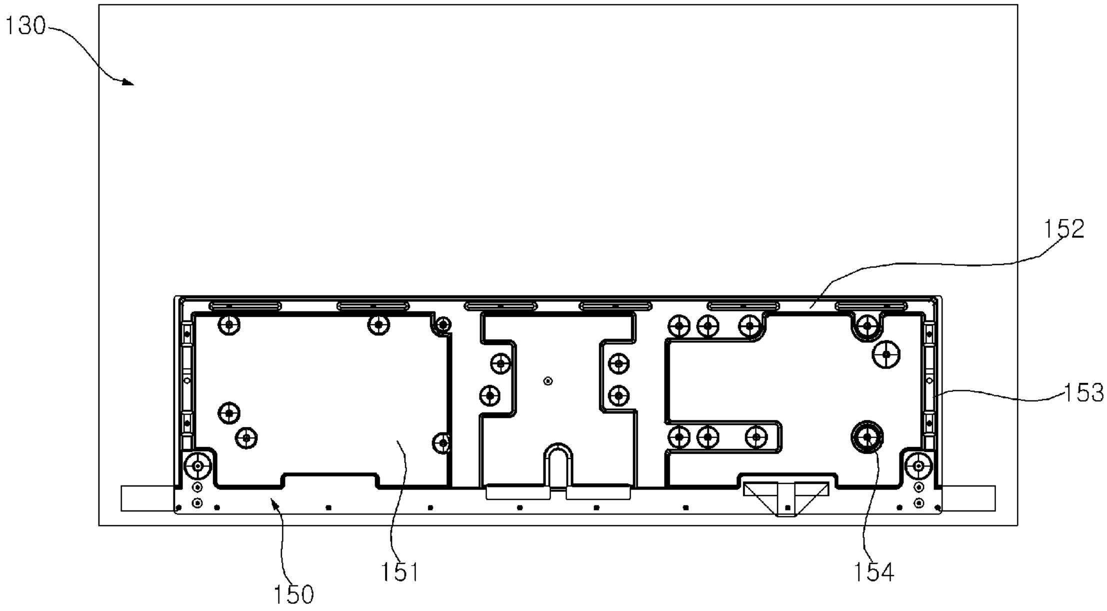
Figure 10:
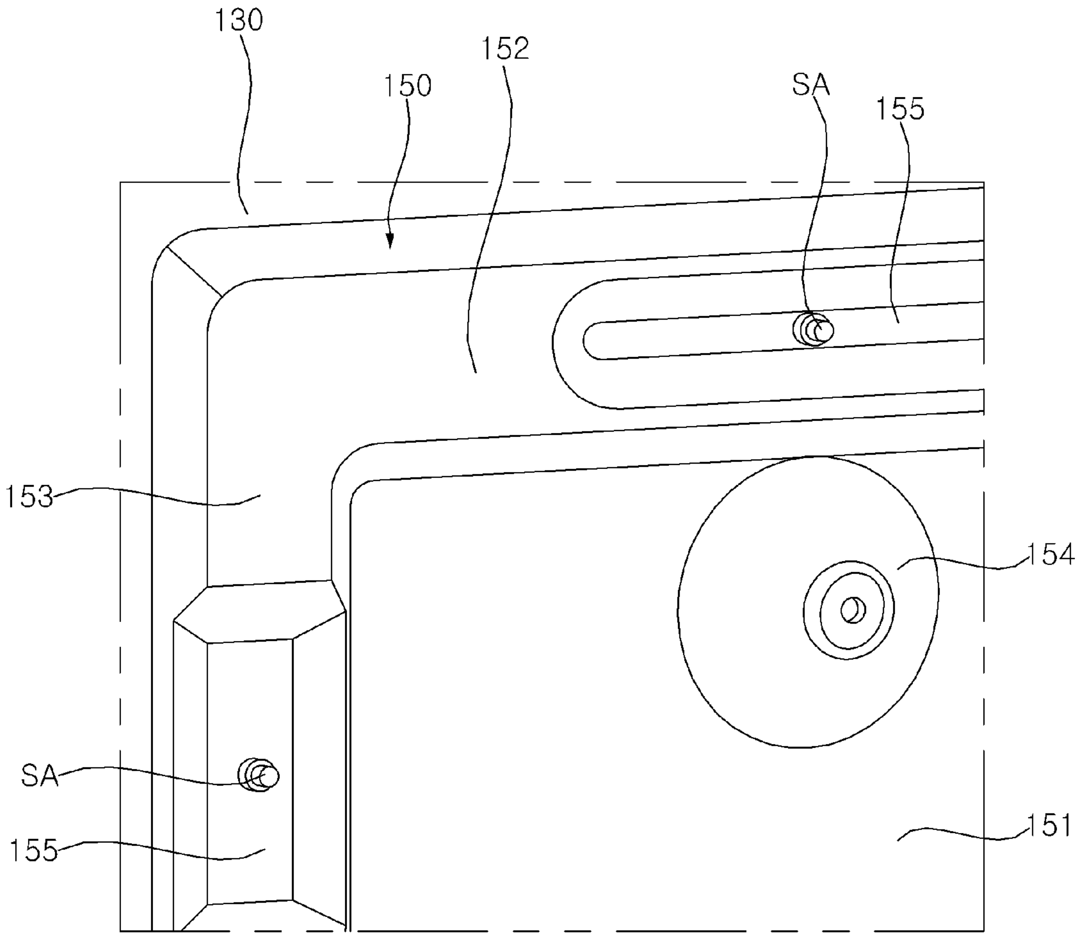

Referring to FIGS. 9 and 10 along with FIG. 8, a PCB plate 150 may be coupled to the rear of the material complexed panel 130. The PCB plate 150 may be fixed to the rear of the material complexed panel 130 by the fastening member S.

The PCB plate 150 may be formed by pressing a plate 151 including metal. The PCB plate 150 may include a horizontal part 152, a vertical part 153, a dome part 154, and a recessed part 155. The horizontal part 152 may protrude from the front of the PCB plate 151 toward the rear thereof and may be elongated in the left-right direction of the PCB plate 151. The vertical part 153 may protrude from the front of the PCB plate 151 toward the rear thereof and may be elongated in the up-down direction of the PCB plate 150. The dome part 154 may protrude from the front of the PCB plate 151 toward the rear thereof. The recessed part 155 may be recessed from the rear of the vertical part 153 and/or the horizontal part 152 to the front thereof.

The shaft SA of the fastening member S may pass through the recessed part 155, formed in the vertical part 153 and/or the horizontal part 152, to couple the material complexed panel 130 and the PCB plate 150. A depth of the recessed part 155 may be greater than a protrusion length of the shaft SA of the fastening member S that protrudes rearwardly by passing through the material complexed panel 130.

Figure 11:
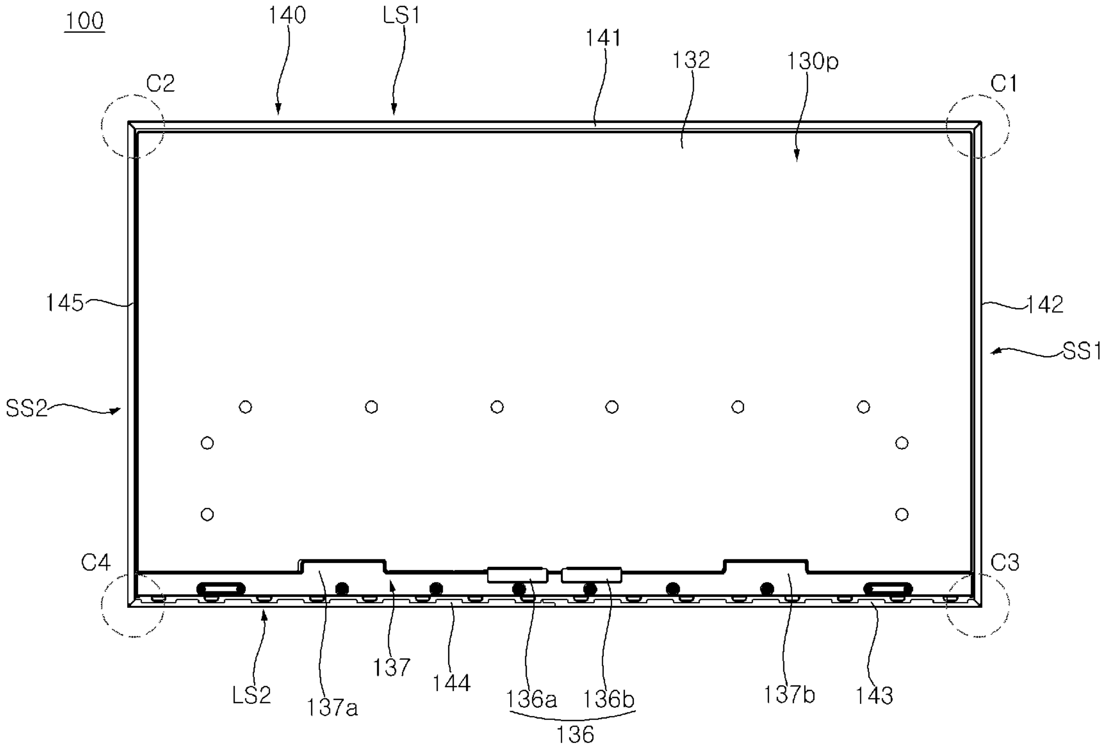
Figure 12:
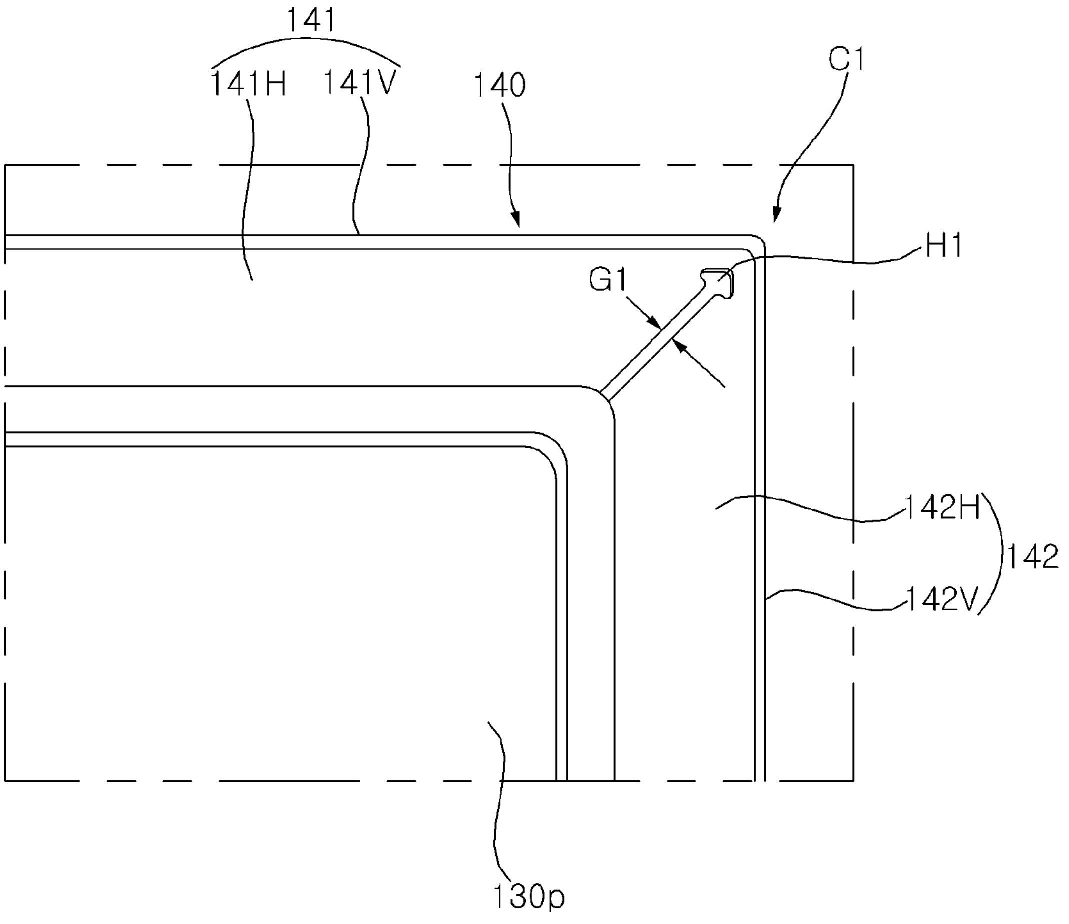

Referring to FIGS. 11 and 12, a side frame 140 may be coupled to the outer part 135 (see FIG. 5) at a position adjacent to the flat plate part 130P. The side frame 140 may include a first part 141, a second part 142, a third part 143, a fourth part 144, and a fifth part 145. The second part 142 may be bent at a first corner C1 from the first part 141.

The first part 141 may include a horizontal part 141H and a vertical part 141V. The horizontal part 141H of the first part 141 may be fixed onto the first outer part 135*a* (see FIG. 5). The second part 142 may include a horizontal part 142H and a vertical part 142V. The horizontal part 142H of the second part 142 may be fixed onto the fourth outer part 135*d* (see FIG. 5).

A gap G1 may be formed between the horizontal part 141H of the first part 141 and the horizontal part 142H of the second part 142. The vertical part 141V of the first part 141 and the vertical part 142V of the second part 142 may be bent and connected to each other. A hole H1 connected to the gap G1 may be formed between the horizontal parts 141H and 142H at a position adjacent to the vertical parts 141V and 142V. A size of the hole H1 or a diameter of the hole H1 may be greater than a width of the gap G1. A description of the first corner C1 of the side frame 140 may also be applied to a second corner C2 of the side frame 140.

Figure 13:
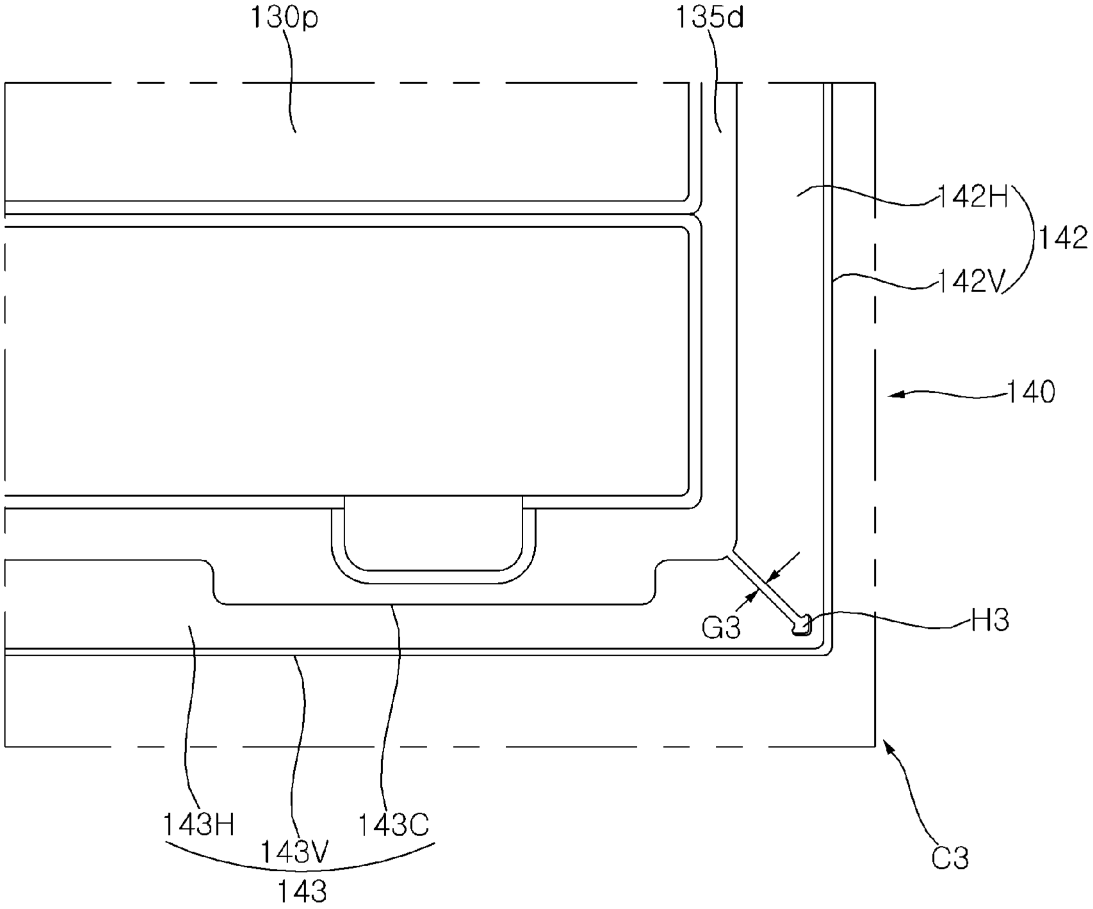

Referring to FIGS. 11 and 13, the side frame 140 may be coupled to the outer part 135 (see FIG. 5) at a position adjacent to the flat plate part 130P of the side frame 140. The side frame 140 may include the first part 141, the second part 142, the third part 143, the fourth part 144, and the fifth part 145. The second part 142 may be bent at a third corner C3 from the third part 143.

The third part 143 may include a horizontal part 143H and a vertical part 143V. The horizontal part 143H of the third part 143 may be fixed onto the third outer part 135*c* (see FIG. 5). The second part 142 may include the horizontal part 142H and the vertical part 142V. The horizontal part 142H of the second part 142 may be fixed onto the fourth outer part 135*d* (see FIG. 5).

A gap G3 may be formed between the horizontal part 143H of the third part 143 and the horizontal part 142H of the second part 142. The vertical part 143V of the third part 143 and the vertical part 142V of the second part 142 may be bent and connected to each other. A hole H3 connected to the gap G3 may be formed between the horizontal parts 143H and 142H at a position adjacent to the vertical parts 143V and 142V. A size of the hole H3 or a diameter of the hole H3 may be greater than a width of the gap G3. A description of the third corner C3 of the side frame 140 may also be applied to a fourth corner C4 of the side frame 140.

Figure 14:
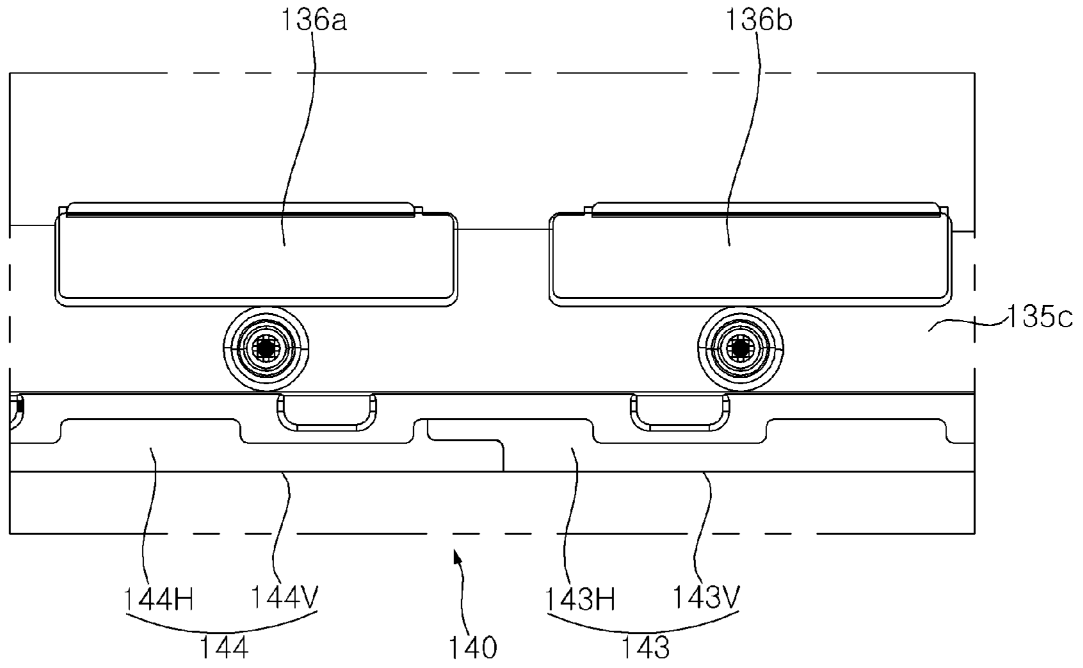

Referring to FIGS. 11 and 14, the third part 143 and the fourth part 144 of the side frame 140 may be disposed on the third outer part 135*c* or may be fixed thereto. An end of the third part 143 of the side frame 140 may be coupled to an end of the fourth part 144 of the side frame 140.

A horizontal part 144H of the fourth part 144 may come into contact with the horizontal part 143H and the vertical part 143V of the third part 143. A vertical part 144V of the fourth part 144 may come into contact with the vertical part 143V of the third part 143. The vertical part 143V of the third part 143 may come into contact with the horizontal part 144H and the vertical part 144V of the fourth part 144. The end of the third part 143 may be fixed to the end of the fourth part 144. For example, the end of the third part 143 may be fixed to the end of the fourth part 144 by welding.

Figure 15:
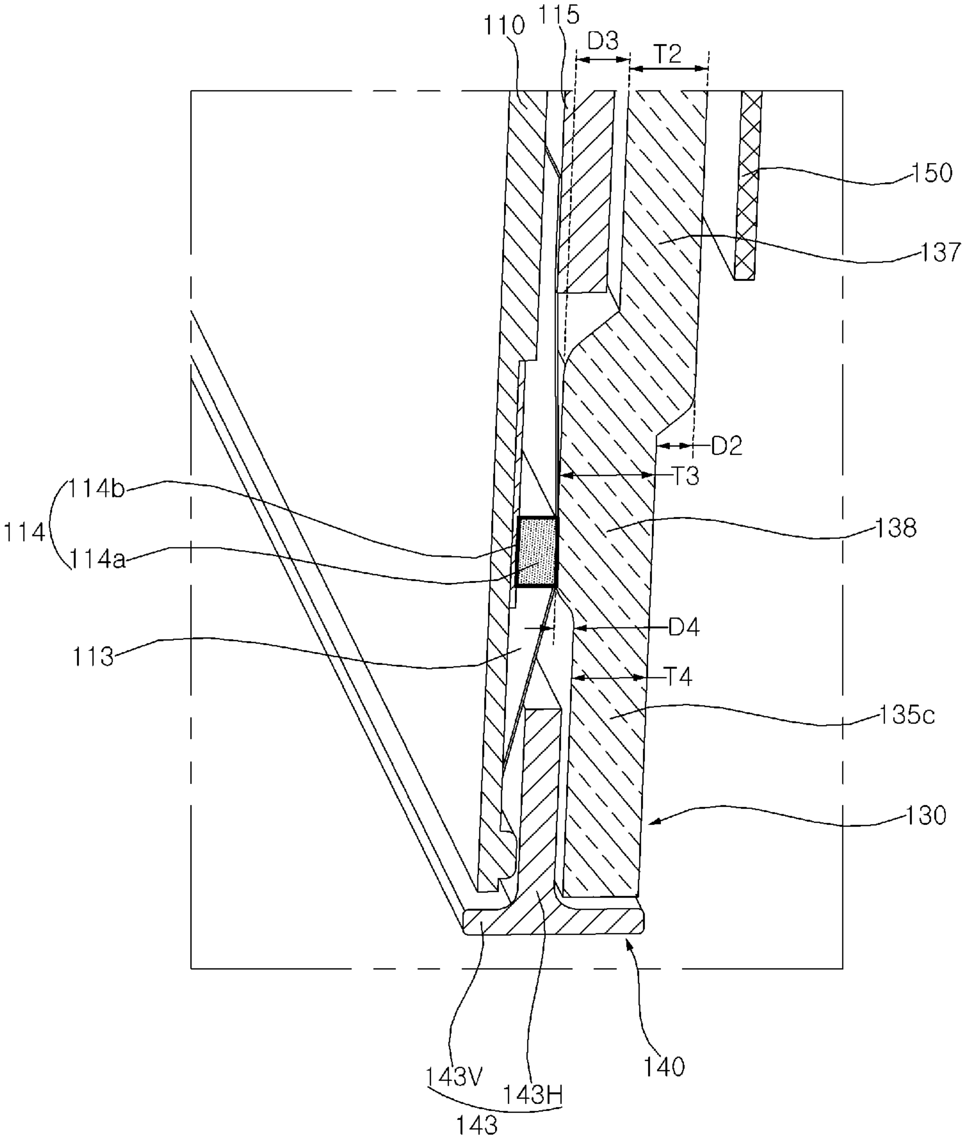

Referring to FIG. 15, the display panel 110 may be coupled or fixed onto the side frame 140. The horizontal part 143H of the side frame 140 may support the rear surface of the display panel 110, and the vertical part 143V may cover a side surface of the display panel 110. For example, the vertical part 143V of the third part 143 of the side frame 140 may cover a side surface of the lower side of the display panel 110.

The vertical part 143V may cover a side surface of the material complexed panel 130. For example, the vertical part 143V of the third part 143 of the side frame 140 may cover a side surface of the third outer part 135*c* of the material complexed panel 130.

A flexible cable 113 may extend from the lower side of the display panel 110 and between the display panel 110 and the horizontal part 143H of the side frame 140. The flexible cable 113 may extend between a rear surface of the display panel 110 and the material complexed panel 130. For example, the flexible cable 113 may be a COF 113.

A source signal board 115 may be electrically connected to the flexible cable 113. The source signal board 115 may be fixed to one surface of the flexible cable 113. For example, the source signal board 115 may be an S-PCB 115. The source signal board 115 may be disposed in the receiving part 137 of the material complexed panel 130.

The flexible cable 113 may be disposed between the protruding pad 138 of the material complexed panel 130 and the display panel 110. The flexible cable 113 may contact the protruding pad 138. Heat generated from the source signal board 115 and/or the flexible cable 113 may be dissipated through the protruding pad 138.

A heat dissipating pad 114 may be disposed between the flexible cable 113 and the rear surface of the display panel 110 that are in contact with the protruding pad 138. The heat dissipating pad 114 may include an elastic material 114*a* and a conductive film 114*b*. A core 114*a* of the heat dissipating pad 114 may be made of an elastic material, and the conductive film 114*b* may cover the core 114*a* of the heat dissipating pad 114. Accordingly, the flexible cable 113 may be maintained in contact with the protruding pad 138.

Figure 16:
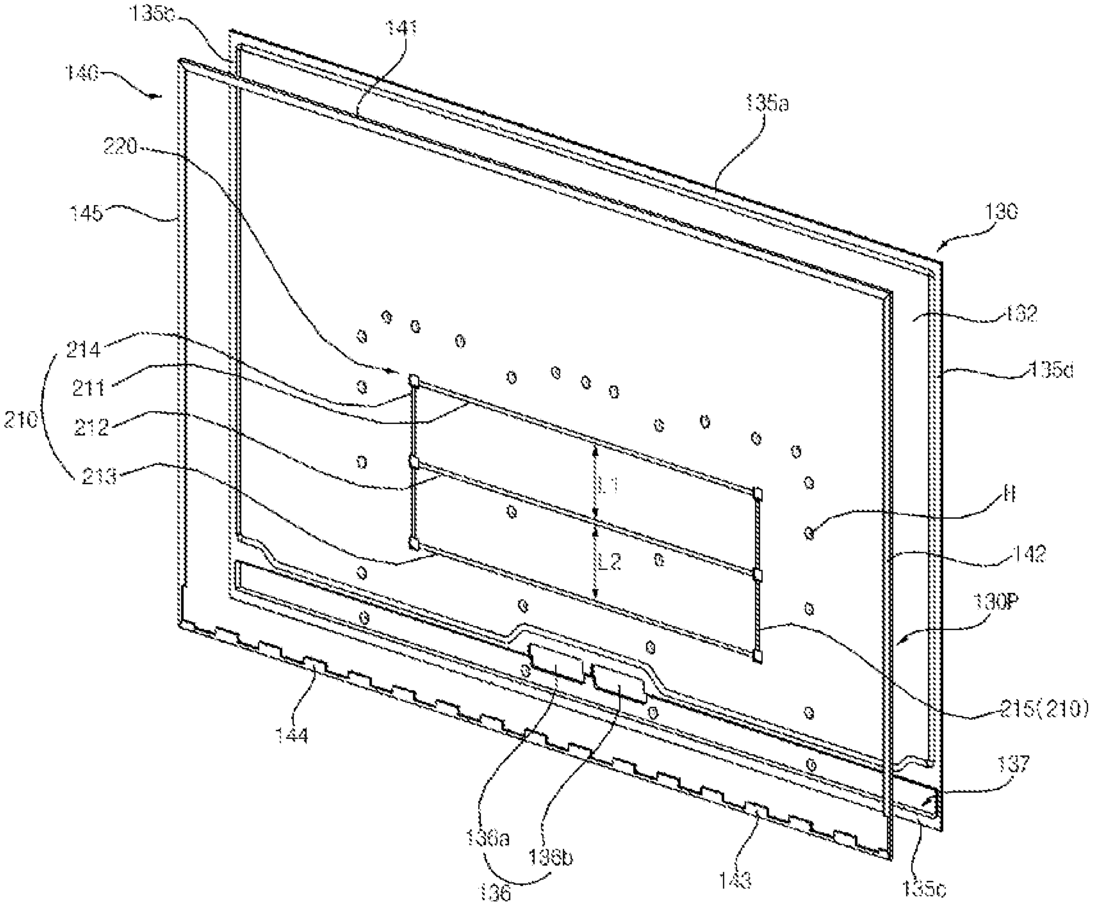
Figure 17:
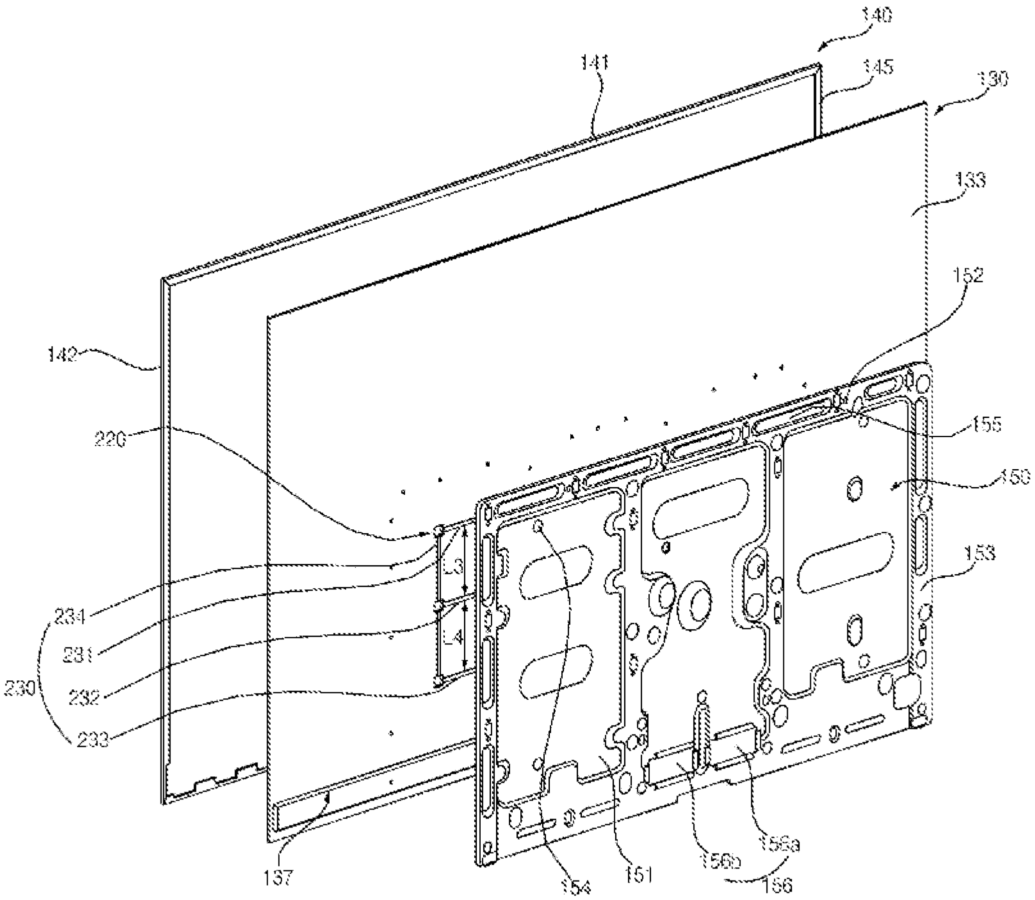

Referring to FIGS. 16 and 17, inner frames 210 and 230 may be formed on a front surface and/or a rear surface of the material complexed panel 130. The inner frames 210 and 230 may be referred to as pressed frames 210 and 230 or rigid lines 210 and 230. The inner frames 210 and 230 may be formed by recessing the front skin 132 and/or the rear skin 133 and by pressing the core 131 (see FIG. 2).

The inner frames 210 and 230 may include a front inner line 210, a rear inner line 230, and a node hole 220. The front inner line 210 may be formed by recessing the front skin 132 of the material complexed panel 130. The rear inner line 230 may be formed by recessing the rear skin 133 of the material complexed panel 130.

The front inner line 210 may include a first front horizontal line 211, a second front horizontal line 212, a third front horizontal line 213, a first front vertical line 214, and a second front vertical line 215. The first front horizontal line 214 may form an upper side of the front inner line 210. The third front horizontal line 213 may form a lower side of the front inner line 210. The second front horizontal line 212 may be disposed between the first front horizontal line 211 and the third front horizontal line 213. The first front vertical line 213 may connect a first end of the first front horizontal line 211, a first end of the second front horizontal line 212, and a first end of the third front horizontal line 213. The second front vertical line 215 may connect a second end of the first front horizontal line 211, a second end of the second front horizontal line 212, and a second end of the third front horizontal line 213. For example, a first distance L1 between the first front horizontal line 211 and the second front horizontal line 212 may be smaller than a second distance L2 between the second front horizontal line 212 and the third front horizontal line 213.

The node hole 220 may be formed at a point where the front horizontal lines 211, 212, and 213 and the front vertical lines 214 and 215 meet each other. The node hole 220 may be formed through the front skin 132, the core 131, and the rear skin 133 of the material complexed panel 130.

The rear inner line 230 may include a first rear horizontal line 231, a second rear horizontal line 232, a third rear horizontal line 233, a first rear vertical line 234, and a second rear vertical line 235 (not shown). The first rear horizontal line 234 may form an upper side of the rear inner line 230. The third rear horizontal line 233 may form a lower side of the rear inner line 230. The second rear horizontal line 232 may be disposed between the first rear horizontal line 231 and the third rear horizontal line 233. The first rear vertical line 234 may connect a first end of the first rear horizontal line 231, a first end of the second rear horizontal line 232, and a first end of the third rear horizontal line 233. The second rear vertical line 235 (not shown) may connect a second end of the first rear horizontal line 231, a second end of the second rear horizontal line 232, and a second end of the third rear horizontal line 233. For example, a third distance L3 between the first rear horizontal line 231 and the second rear horizontal line 232 may be smaller than a fourth distance L4 between the second rear horizontal line 232 and the third rear horizontal line 233.

The node hole 220 may be formed at a point where the rear horizontal lines 231, 232, and 233 and the rear vertical lines 234 and 235 meet each other. The node hole 220 may be formed through the front skin 132, the core 131, and the rear skin 133 of the material complexed panel 130.

A length of the rear inner line 230 may be shorter than a length of the PCB plate 150. A width of the rear inner line 230 may be smaller than a width of the PCB plate 150. The PCB plate 150 may cover the rear inner line 230.

Accordingly, bending stiffness and/or torsional stiffness of the material complexed panel 130 may be improved.

Figure 18:
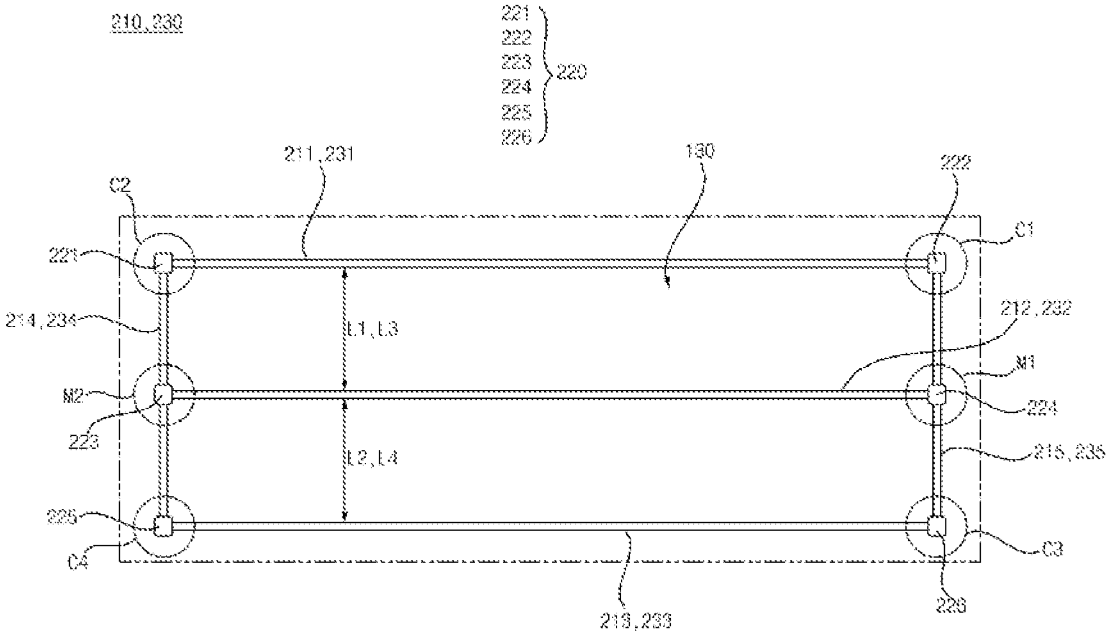

Referring to FIG. 18, there may be a plurality of node holes 220. The plurality of node holes 220 may include a first node hole 221, a second node hole 222, a third node hole 223, a fourth node hole 224, a fifth node hole 225, and a sixth node hole 226.

The first node hole 221 may be located at a corner C2 formed by the first horizontal lines 211 and 231 and the first vertical lines 214 and 234. The first node hole 221 may be formed through the material complexed panel 130 at the corner C2 between the first horizontal lines 211 and 231 and the first vertical lines 214 and 234.

The second node hole 222 may be located at a corner C1 formed by the first horizontal lines 211 and 231 and the second vertical lines 212 and 232. The second node hole 222 may be formed through the material complexed panel 130 at the corner C1 between the first horizontal lines 211 and 231 and the second vertical lines 212 and 232.

The third node hole 223 may be located at a node M2 formed by the second horizontal lines 212 and 232 and the first vertical lines 214 and 234. The third node hole 223 may be formed through the material complexed panel 130 at the node M2 between the second horizontal lines 212 and 232 and the first vertical lines 214 and 234.

The fourth node hole 224 may be located at a node M1 formed by the second horizontal lines 212 and 232 and the second vertical lines 212 and 232. The fourth node hole 224 may be formed through the material complexed panel 130 at the node M1 between the second horizontal lines 212 and 232 and the second vertical lines 212 and 232.

The fifth node hole 225 may be located at a corner C4 formed by third horizontal lines 213 and 233 and the first vertical lines 214 and 234. The fifth node hole 225 may be formed through the material complexed panel 130 at the corner C4 between the third horizontal lines 213 and 233 and the first vertical lines 214 and 234.

The sixth node hole 226 may be located at a corner C3 formed by the third horizontal lines 213 and 233 and the second vertical lines 212 and 232. The sixth node hole 226 may be formed through the material complexed panel 130 at the corner C3 between the third horizontal lines 213 and 233 and the second vertical lines 212 and 232.

Accordingly, it is possible to improve not only the bending stiffness and/or torsional stiffness of the material complexed panel 130 but also flatness of the display panel 110 coupled to the material complexed panel 130.

Figure 19:
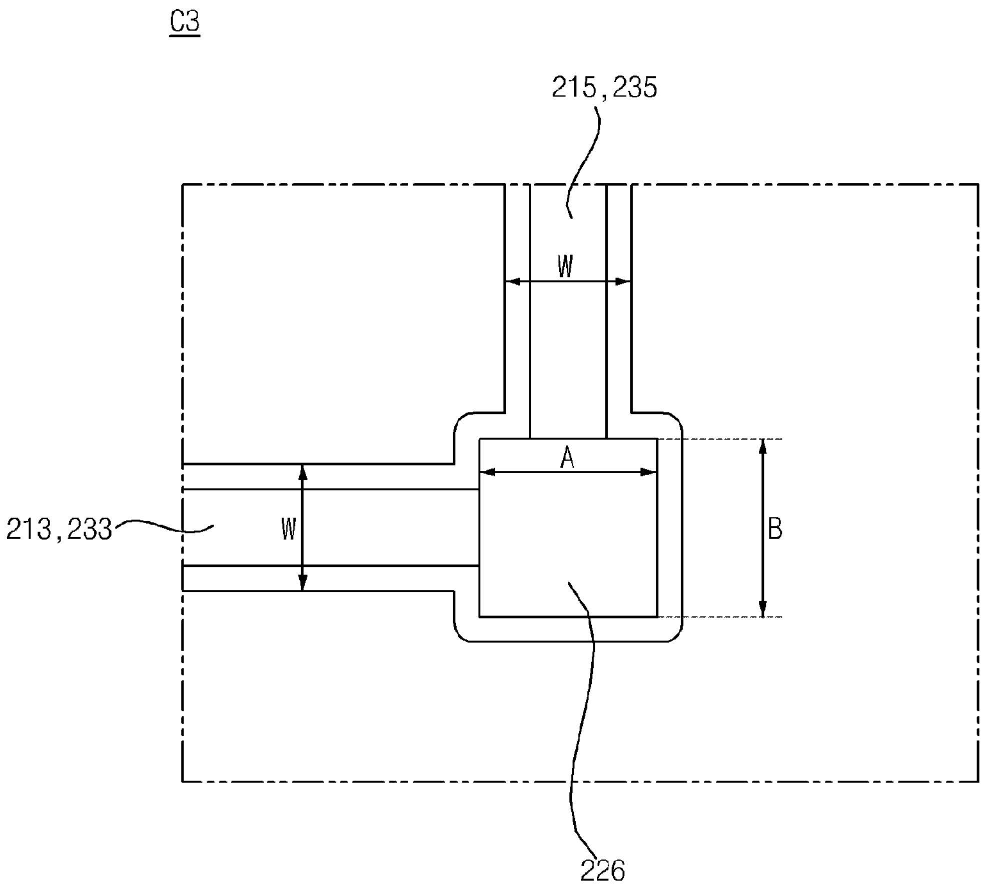

Referring to FIG. 19, a size of the sixth node hole 226 may be greater than a width of the third horizontal lines 213 and 233 and/or the second vertical lines 215 and 235. For example, if the sixth node hole 226 has a square shape, widths A and B of the sixth node hole 226 may be greater than a width W of the third horizontal lines 213 and 233 and/or the second vertical lines 215 and 235. In another example, if the sixth node hole 226 has a circular shape, a diameter of the sixth node hole 226 may be greater than the widths of the third horizontal lines 213 and 233 and/or the second vertical lines 215 and 235. A description of the sixth node hole 226 may also be applied to the first node hole 221, the second node hole 222, and/or the fifth node hole 225.

Figure 20:
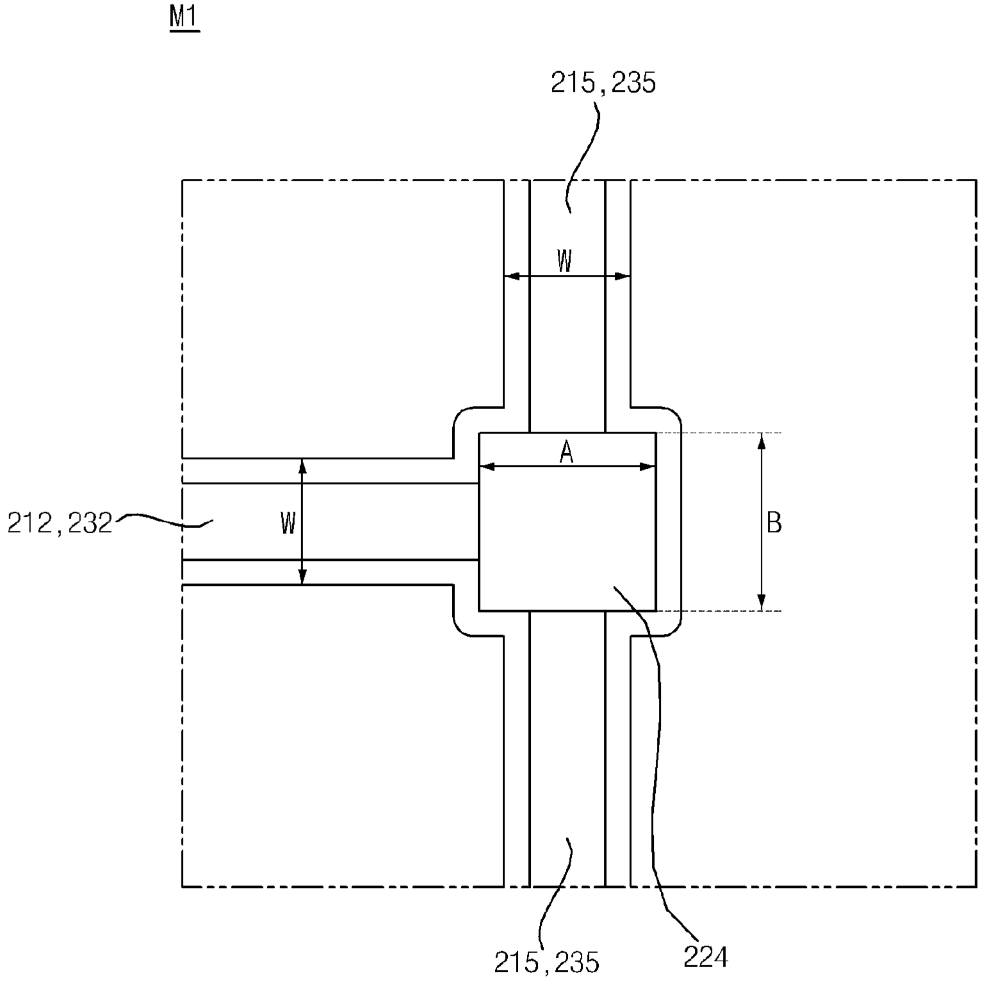

Referring to FIG. 20, a size of the fourth node hole 224 may be greater than widths of the second horizontal lines 212 and 232 and/or the second vertical lines 215 and 235. For example, if the fourth node hole 224 has a square shape, widths A and B of the fourth node hole 224 may be greater than the widths of the second horizontal lines 212 and 232 and/or the second vertical lines 215 and 235. In another example, if the fourth node hole 224 has a circular shape, a diameter of the fourth node hole 224 may be greater than the widths of the second horizontal lines 212 and 232 and/or the second vertical lines 215 and 235. A description of the fourth node hole 224 may also be applied to the third node hole 223.

Figure 21:
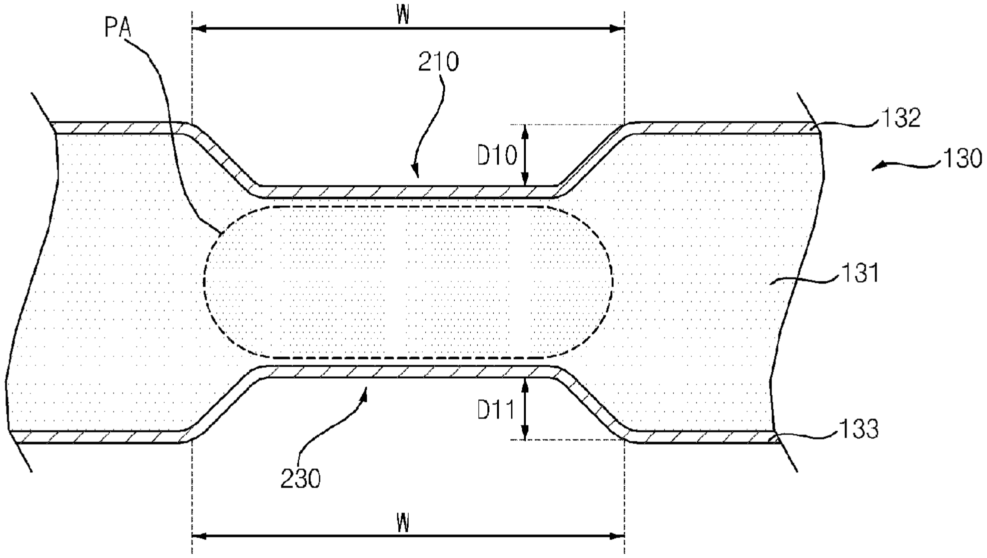

Referring to FIG. 21, the front inner line 210 may be formed on the material complexed panel 130 as the core 131 is pressed and the front skin 132 is recessed. The rear inner line 230 may be formed on the material complexed panel 130 as the core 131 is pressed and the rear skin 133 is recessed.

The front inner line 210 and the rear inner line 230 may be symmetrical with respect to the core 131. For example, a width W of the front inner line 210 may be substantially equal to a width W of the rear inner line 230. In another example, a depth D10 of the front inner line 210 may be substantially equal to a depth D11 of the rear inner line 230.

A pressed area PA, in which the core 131 is pressed, may be formed between the front inner line 210 and the rear inner line 230. A density of the core 131 in the pressed area PA may be greater than a density of the core 131 in an unpressed area.

Accordingly, bending stiffness and/or torsional stiffness of the material complexed panel 130 may be improved.

Figure 22:
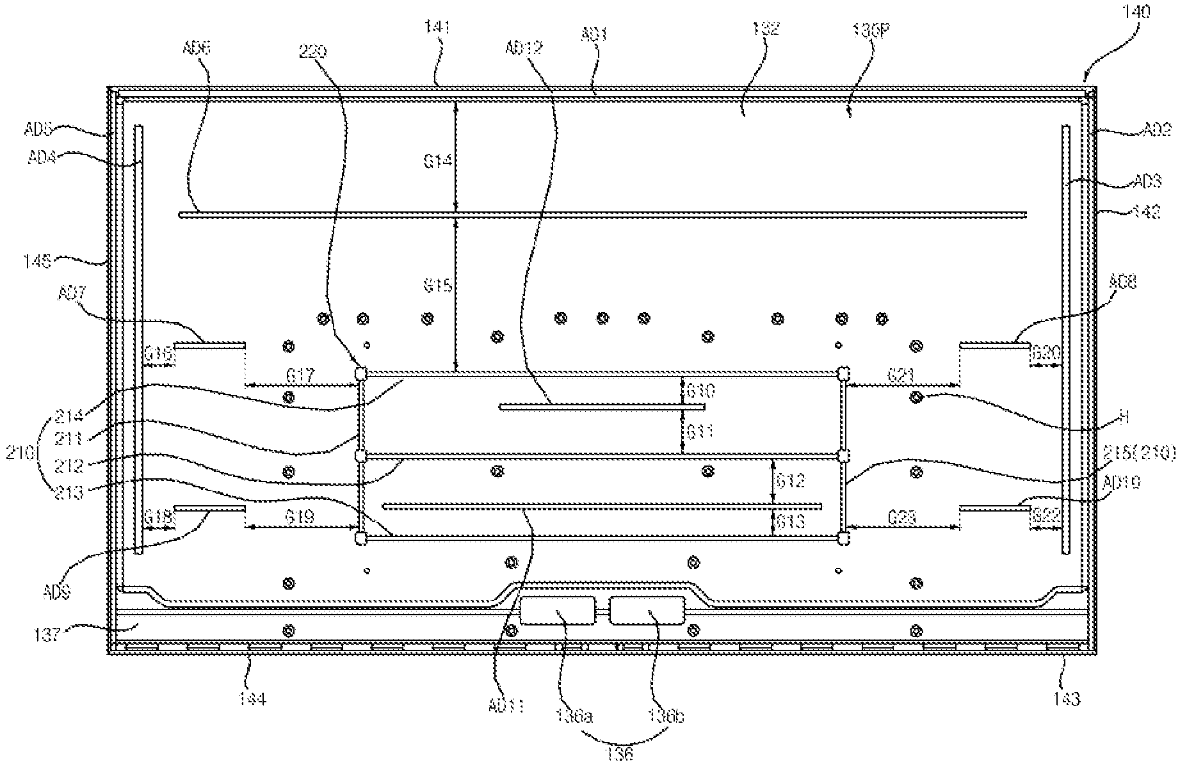

Referring to FIG. 22, an adhesive member AD may be disposed on the flat plate part 130P of the material complexed panel 130. The adhesive member AD may be attached to the front skin 132 of the material complexed panel 130. There may be a plurality of adhesive members AD.

A first adhesive member AD1 may be fixed to the first part 141 of the side frame 140. The first adhesive member AD1 may be elongated in a longitudinal direction of the first part 141 of the side frame 140. The second adhesive member AD2 may be elongated in a longitudinal direction of the second part 142 of the side frame 140 and may be fixed to the second part 142. A third adhesive member AD3 may be elongated in a longitudinal direction of the second part 142 of the side frame 140, may be parallel to the second part 142, and may be fixed to the flat plate part 130P at a position spaced apart from the first adhesive member AD1.

A fifth adhesive member AD5 may be elongated in a longitudinal direction of the fifth part 145 of the side frame 140 and may be fixed to the fifth part 145. A fourth adhesive member AD4 may be elongated in a longitudinal direction of the fifth part 145 of the side frame 140, may be parallel to the fifth part 145, and may be fixed to the flat plate part 130P at a position spaced apart from the fifth adhesive member AD5.

A sixth adhesive member AD6 may be elongated in a longitudinal direction of the first part 141 of the side frame 140 and may be fixed to the flat plate part 130P at a position spaced apart from the first adhesive member AD1. A fourteenth distance G14 from the first part 141 of the side frame 140 to the sixth adhesive member AD6 may be smaller than a fifteenth distance G15 from the sixth adhesive member AD6 to the first front horizontal inner line 211.

A seventh adhesive member AD7 may be elongated in a longitudinal direction of the sixth adhesive member AD6 and may be fixed to the flat plate part 130P at a position between the first front vertical line 214 and the fourth adhesive member AD4. The seventh adhesive member AD7 may be disposed between the sixth adhesive member AD6 and a ninth adhesive member AD9. A sixteenth distance G16 from the fourth adhesive member AD4 to a first end of the seventh adhesive member AD7 may be smaller than a seventeenth distance G17 from the first front vertical line 214 to a second end of the seventh adhesive member AD7.

The ninth adhesive member AD9 may be elongated in a longitudinal direction of the sixth adhesive member AD6 and may be fixed to the flat plate part 130P at a position between the first front vertical line 214 and the fourth adhesive member AD4. The ninth adhesive member AD9 may be disposed between the seventh adhesive member AD7 and the receiving part 137. An eighteenth distance G18 from the fourth adhesive member AD4 to a first end of the ninth adhesive member AD9 may be smaller than a nineteenth distance G19 from the first front vertical line 214 to a second end of the ninth adhesive member AD9.

An eighth adhesive member AD8 may be elongated in a longitudinal direction of the sixth adhesive member AD6 and may be fixed to the flat plate part 130P at a position between the second front vertical line 215 and the third adhesive member AD3. The eighth adhesive member AD8 may be disposed between the sixth adhesive member AD6 and the receiving part 137. A twentieth distance G20 from the third adhesive member AD3 to a first end of the eighth adhesive member AD8 may be smaller than a twenty-first distance G21 from the second front vertical line 215 to a second end of the eighth adhesive member AD8.

A tenth adhesive member AD10 may be elongated in a longitudinal direction of the sixth adhesive member AD6 and may be fixed to the flat plate part 130P at a position between the second front vertical line 215 and the third adhesive member AD3. The tenth adhesive member AD10 may be disposed between the eighth adhesive member AD8 and the receiving part 137. A twenty-second distance G22 from the third adhesive member AD3 to a first end of the tenth adhesive member AD10 may be smaller than a twenty-third distance G23 from the second front vertical line 215 to a second end of the tenth adhesive member AD10.

An eleventh adhesive member AD11 may be elongated in a longitudinal direction of second front horizontal line 212 and may be fixed to the flat plate part 130P at a position between the second front horizontal line 212 and the third front horizontal line 213. A twelfth adhesive member AD12 may be elongated in the longitudinal direction of the second front horizontal line 212 and may be disposed between the first front horizontal line 211 and the second front horizontal line 212. A length of the twelfth adhesive member AD12 may be shorter than a length of the eleventh adhesive member AD11.

A tenth distance G10 between the first front horizontal line 211 and the twelfth adhesive member AD12 may be smaller than an eleventh distance G11 between the twelfth adhesive member AD12 and the second front horizontal line 212. For example, the tenth distance G10 may be 40 mm or more. For example, a distance between a first end of the twelfth adhesive member AD12 and the first vertical front line 214 may be 20 mm or more. In another example, a distance between a second end of the twelfth adhesive member AD12 and the second vertical front line 215 may be 20 mm or more.

A twelfth distance G12 between the second front horizontal line 212 and the eleventh adhesive member AD11 may be greater than a thirteenth distance G13 between the eleventh adhesive member AD11 and the third front horizontal line 213. For example, the thirteenth distance G13 may be 40 mm or more.

The display panel 110 may be bonded or fixed to the material complexed panel 130 by the adhesive members AD. Accordingly, the display panel 110 may be fixed to the material complexed panel 130 in a flat state.

Referring to FIGS. 1 to 22, a display device includes: a display panel 110; a material complexed plate 130 disposed at a rear of the display panel 110; and a side frame 140 which is disposed between the display panel 110 and the material complexed plate 130 and is fixed to the material complexed plate 130, and to which the display panel 110 is coupled, wherein the material complexed plate 130 includes: a front skin 132 forming a front surface; a rear skin 133 forming a rear surface and facing the front skin 132; and a core 131 disposed between the front skin 132 and the rear skin 133 and including fibers; and an inner frame 210 formed by recessing the front skin 132 or the rear skin 133, wherein the inner frame 210 includes: horizontal inner lines 211, 212, 213, 231, 232, and 233 elongated in one direction; and vertical inner lines 214, 215, 234, and 235 elongated in a direction intersecting the one direction.

The material complexed plate 130 may further include a node hole 220 formed at a point where the horizontal inner lines 211, 212, 213, 231, 232, and 233 and the vertical inner lines 214, 215, 234, and 235 intersect, wherein the node hole 220 may pass through the front skin 132 and the rear skin 133.

The horizontal inner lines 211, 212, 213, 231, 232, and 233 may include front horizontal lines 211, 212, and 213 formed by recessing the front skin 132, and rear horizontal lines 231, 232, and 233 opposite to the front horizontal lines 211, 212, and 213 with respect to the core 131 and formed by recessing the rear skin 133; and the vertical inner lines 214, 215, 234, and 235 may include front vertical lines 214 and 215 formed by recessing the front skin 132, and rear vertical lines 234 and 235 opposite to the front vertical lines 214 and 215 with respect to the core 131 and formed by recessing the rear skin 133.

The front horizontal lines 211, 212, and 213 may be provided in plurality, wherein the plurality of front horizontal lines 211, 212, and 213 may include: a first front horizontal line 211; a second front horizontal line 212 parallel to the first front horizontal line 211 and spaced apart from the first front horizontal line 211; and a third front horizontal line 213 opposite to the first front horizontal line 211 with respect to the second front horizontal line 212, wherein a distance L1 between the first front horizontal line 211 and the second front horizontal line 212 may be smaller than a distance L2 between the second front horizontal line 212 and the third front horizontal line 213.

The front vertical lines 214 and 215 may be provided in plurality, wherein the plurality of front vertical lines 214 and 215 may include: a first front vertical line 214 connecting a first end of the first front horizontal line 211, a first end of the second front horizontal line 212, and a first end of the third front horizontal line 213; and a second front vertical line 215 connecting a second end of the first front horizontal line 211, a second end of the second front horizontal line 212, and a second end of the third front horizontal line 213.

The first front vertical line 214 may be parallel to the second front vertical line 215.

The node hole 220 may be provided in plurality, wherein the plurality of node holes 220 may include: a first node hole 221 located at a corner C2 formed by the first front horizontal line 211 and the first front vertical line 214; a second node hole 222 located at a corner C1 formed by the first front horizontal line 211 and the second front vertical line 215; a third node hole 223 located at a node M2 formed by the second front horizontal line 212 and the first front vertical line 214; a fourth node hole 224 located at a node M1 formed by the second front horizontal line 212 and the second front vertical line 215; a fifth node hole 225 located at a corner C4 formed by the third front horizontal line 213 and the first front vertical line 214; and a sixth node hole 226 located at a corner C3 formed by the third front horizontal line 213 and the second front vertical line 215.

The node hole 220 may have a square shape, and a length of one side (A, B) of the node hole 220 may be greater than widths of the horizontal inner lines 211, 212, 213, 231, 232, and 233 or the vertical inner lines 214, 215, 234, and 235.

There are included: a first adhesive member AD12 elongated in a longitudinal direction of the second front horizontal line 212 at a position between the first front horizontal line 211 and the second front horizontal line 212 and fixed to the front skin 132; and a second adhesive member AD11 elongated in a longitudinal direction of the second front horizontal line 212 at a position between the second front horizontal line 212 and the third front horizontal line 213 and fixed to the front skin 132, wherein a length of the second adhesive member AD11 may be longer than a length of the first adhesive member AD12.

A distance G10 between the first adhesive member AD12 and the first front horizontal line 211 may be smaller than a distance G11 between the first adhesive member AD12 and the second front horizontal line 212.

A distance between the second adhesive member AD11 and the third front horizontal line 213 may be smaller than a distance between the second adhesive member AD11 and the second front horizontal line 212.

A density of the core 131 between the front horizontal lines 211, 212, and 213 and the rear horizontal lines 231, 232, and 233 or between the front vertical lines 214 and 215 and the rear vertical lines 234 and 235 may be greater than a density of the core 131 between the front skin 132 and the rear skin 133.

Certain embodiments or other embodiments of the invention described above are not mutually exclusive or distinct from each other. Any or all elements of the embodiments of the invention described above may be combined or combined with each other in configuration or function.

For example, a configuration "A" described in one embodiment of the invention and the drawings and a configuration "B" described in another embodiment of the invention and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
- a display panel;
- a material complexed plate disposed at a rear of the display panel; and
- a side frame disposed between the display panel and the material complexed plate, fixed to the material complexed plate, and coupled with the display panel,
- wherein the material complexed plate comprises:
  - a front skin forming a front surface;
  - a rear skin forming a rear surface and facing the front skin; and
  - a core disposed between the front skin and the rear skin and including fibers; and
  - an inner frame formed by recessing at least one of the front skin or the rear skin,
- wherein the inner frame comprises:
  - a horizontal inner line elongated in a first direction; and
  - a vertical inner line elongated in a second direction intersecting the first direction,
- wherein the material complexed plate further comprises a node hole formed at an area where the horizontal inner line and the vertical inner line intersect, and
- wherein the node hole penetrates the front skin and the rear skin.

2. The display device of claim 1, wherein the horizontal inner line includes a plurality of horizontal inner lines and the vertical inner line includes a plurality of vertical inner lines, wherein:
- the plurality of horizontal inner lines comprise a plurality of front horizontal lines formed by recessing the front skin, and a plurality of rear horizontal lines opposite to the plurality of front horizontal lines with respect to the core and formed by recessing the rear skin; and the plurality of vertical inner lines comprise a plurality of front vertical lines formed by recessing the front skin, and a plurality of rear vertical lines opposite to the plurality of front vertical lines with respect to the core and formed by recessing the rear skin.

3. The display device of claim 2, wherein the plurality of front horizontal lines comprises:

a first front horizontal line;

a second front horizontal line parallel to the first front horizontal line and spaced apart from the first front horizontal line; and a third front horizontal line opposite to the first front horizontal line with respect to the second front horizontal line, wherein a distance between the first front horizontal line and the second front horizontal line is smaller than a distance between the second front horizontal line and the third front horizontal line.

4. The display device of claim 3, wherein the plurality of front vertical lines comprises:

a first front vertical line connecting a first end of the first front horizontal line, a first end of the second front horizontal line, and a first end of the third front horizontal line; and a second front vertical line connecting a second end of the first front horizontal line, a second end of the second front horizontal line, and a second end of the third front horizontal line.

5. The display device of claim 4, wherein the first front vertical line is parallel to the second front vertical line.

6. The display device of claim 5, wherein the node hole includes a plurality of node holes, wherein the plurality of node holes comprise:

a first node hole located at a corner formed by the first front horizontal line and the first front vertical line;

a second node hole located at a corner formed by the first front horizontal line and the second front vertical line;

a third node hole located at a node formed by the second front horizontal line and the first front vertical line;

a fourth node hole located at a node formed by the second front horizontal line and the second front vertical line;

a fifth node hole located at a corner formed by the third front horizontal line and the first front vertical line; and a sixth node hole located at a corner formed by the third front horizontal line and the second front vertical line.

7. The display device of claim 2, wherein the node hole has a square shape, and a length of one side of the node hole is greater than widths of the plurality of horizontal inner lines or the plurality of vertical inner lines.

8. The display device of claim 4, further comprising:

a first adhesive member elongated in a longitudinal direction of the second front horizontal line between the first front horizontal line and the second front horizontal line and fixed to the front skin; and a second adhesive member elongated in a longitudinal direction of the second front horizontal line between the second front horizontal line and the third front horizontal line and fixed to the front skin, wherein a length of the second adhesive member is longer than a length of the first adhesive member.

9. The display device of claim 8, wherein a distance between the first adhesive member and the first front horizontal line is smaller than a distance between the first adhesive member and the second front horizontal line.

10. The display device of claim 8, wherein a distance between the second adhesive member and the third front horizontal line is smaller than a distance between the second adhesive member and the second front horizontal line.

11. A display device comprising:

a display panel;

a material complexed plate disposed at a rear of the display panel; and a side frame disposed between the display panel and the material complexed plate, fixed to the material complexed plate, and coupled with the display panel, wherein the material complexed plate comprises:

a front skin forming a front surface;

a rear skin forming a rear surface and facing the front skin; and a core disposed between the front skin and the rear skin and including fibers; and an inner frame formed by recessing at least one of the front skin or the rear skin, wherein the inner frame comprises:

a horizontal inner line elongated in a first direction; and a vertical inner line elongated in a second direction intersecting the first direction, and wherein the horizontal inner line includes a plurality of horizontal inner lines and the vertical inner line includes a plurality of vertical inner lines, wherein:

the plurality of horizontal inner lines comprise a plurality of front horizontal lines formed by recessing the front skin, and a plurality of rear horizontal lines opposite to the plurality of front horizontal lines with respect to the core and formed by recessing the rear skin; and the plurality of vertical inner lines comprise a plurality of front vertical lines formed by recessing the front skin, and a plurality of rear vertical lines opposite to the plurality of front vertical lines with respect to the core and formed by recessing the rear skin, wherein a density of the core between the plurality of front horizontal lines and the plurality of rear horizontal lines or between the plurality of front vertical lines and the plurality of rear vertical lines is greater than a density of the core between the front skin and the rear skin.

* * * * *